United States Patent
Ganther, Jr. et al.

(10) Patent No.: US 7,091,718 B1
(45) Date of Patent: Aug. 15, 2006

(54) SYSTEM HAVING UNMODULATED FLUX LOCKED LOOP FOR MEASURING MAGNETIC FIELDS

(75) Inventors: Kenneth R. Ganther, Jr., Olathe, KS (US); Lowell D. Snapp, Blue Springs, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 10 days.

(21) Appl. No.: 10/789,787

(22) Filed: Feb. 27, 2004

(51) Int. Cl.
  *G01R 33/035* (2006.01)
(52) U.S. Cl. .................................. 324/248; 505/846
(58) Field of Classification Search ........ 505/845–846; 327/527–528; 324/248
  See application file for complete search history.

(56) References Cited

U.S. PATENT DOCUMENTS

| | | |
|---|---|---|
| 5,231,353 A | 7/1993 | Nakayama et al. |
| 5,453,690 A | 9/1995 | Kruger et al. |
| 5,469,057 A | 11/1995 | Robinson |
| 5,532,592 A | 7/1996 | Colclough |
| 5,596,273 A | 1/1997 | Yabe et al. |
| 5,635,834 A | 6/1997 | Sloggett et al. |
| 6,356,078 B1 | 3/2002 | Ganther, Jr. et al. |
| 6,420,868 B1 | 7/2002 | Ganther, Jr. et al. |
| 6,448,767 B1 | 9/2002 | Ganther, Jr. et al. |
| 6,498,483 B1 * | 12/2002 | Hirano et al. ............... 324/248 |

* cited by examiner

*Primary Examiner*—Bot LeDynh
(74) *Attorney, Agent, or Firm*—Hovey Williams LLP

(57) ABSTRACT

A system (10) for measuring magnetic fields, wherein the system (10) comprises an unmodulated or direct-feedback flux locked loop (12) connected by first and second unbalanced RF coaxial transmission lines (16a, 16b) to a superconducting quantum interference device (14). The FLL (12) operates for the most part in a room-temperature or non-cryogenic environment, while the SQUID (14) operates in a cryogenic environment, with the first and second lines (16a, 16b) extending between these two operating environments.

18 Claims, 2 Drawing Sheets

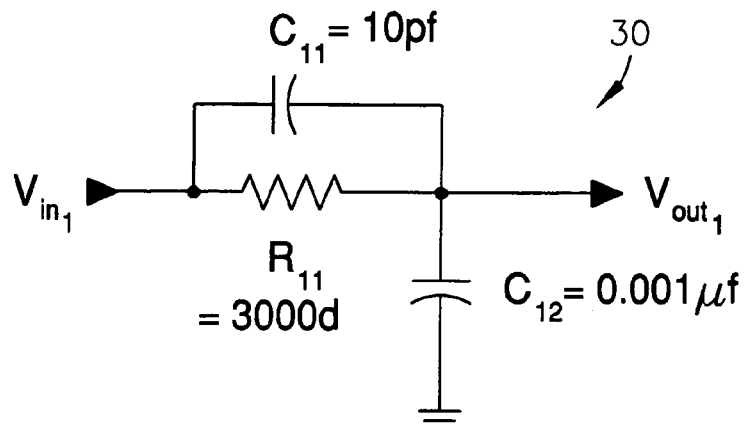
FIG. 2
$$\frac{V_{out_1}}{V_{in_1}} = \frac{(R_{11}C_{11}s + 1)}{(R_{11}C_{11} + R_{11}C_{12})s + 1}$$
FIG. 3
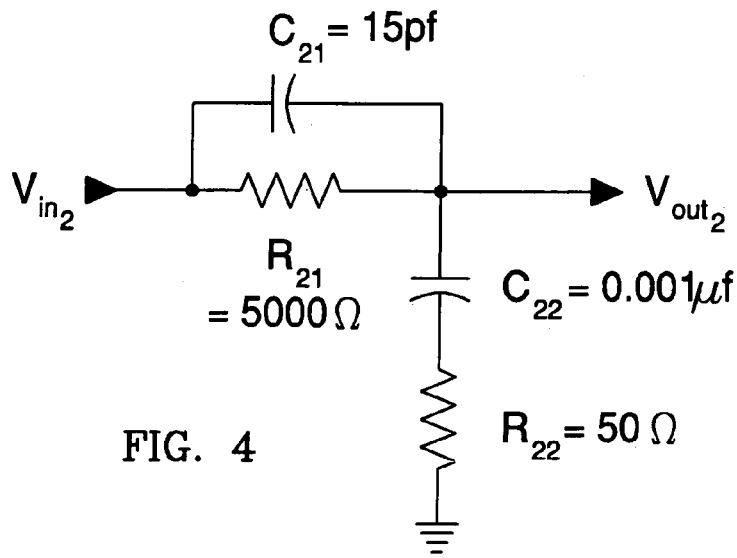
FIG. 4
$$\frac{V_{out_2}}{V_{in_2}} = \frac{(R_{21}C_{21}s + 1)(R_{22}C_{22}s + 1)}{R_{21}C_{21}R_{22}C_{22}s^2 + (R_{21}C_{21} + R_{22}C_{22} + R_{21}C_{22})s + 1}$$
FIG. 5

SYSTEM HAVING UNMODULATED FLUX LOCKED LOOP FOR MEASURING MAGNETIC FIELDS

FEDERALLY SPONSORED RESEARCH OR DEVELOPMENT PROGRAM

The present invention was developed with support from the U.S. government under Contract No. DE-AC04-01AL66850 with the U.S. Department of Energy. Accordingly, the U.S. government has certain rights in the present invention.

BACKGROUND OF THE INVENTION

1. Field of the Invention

The present invention relates broadly to systems for measuring magnetic fields using flux licked loops and superconducting quantum interference devices. More particularly, the present invention concerns a system comprising an unmodulated or direct-feedback flux locked loop electrically connected by first and second unbalanced coaxial transmission lines to a superconducting quantum interference device.

2. Description of the Prior Art

Superconducting quantum interference devices (SQUIDs) are small, cryogenically-cooled magnetic field sensors comprising a ring of superconducting material interrupted by two Josephson junctions. SQUIDs are designed to detect changes in magnetic flux, and, when suitably biased with a small DC current, will exhibit a magnetic flux sensitivity noise floor of approximately $1 \times 10^{-6}$ 0/Hz for low temperature devices that operate near 4 degrees Kelvin (typically cooled by liquid Helium), and approximately $7 \times 10^{-6}$ 0/Hz for high temperature devices that operate near 77 degrees Kelvin (typically cooled by liquid Nitrogen). SQUIDs exhibit a transfer function that converts magnetic flux into a periodic electrical output signal.

The standard read-out method for SQUID measurements is to inject an alternating current (AC) magnetic field modulation signal into the SQUID and then, using a flux locked loop (FLL) circuit, sense changes in the modulating signal due to external magnetic fields. Without the FLL, the SQUID would have a very limited dynamic range because of its extremely non-linear magnetic field-to-voltage transfer function characteristic. The FLL maintains a stable magnetic flux operating point at the SQUID by introducing a feedback magnetic flux that precisely counteracts the externally applied magnetic field, provided the slew rate and dynamic range of the SQUID and FLL are not exceeded. Measurements of the external magnetic flux can be made by measuring the feedback signal which is an identical image of the external magnetic flux signal within the tracking bandwidth of the FLL.

Also, as the input magnetic signal to the SQUID is varied, the output voltage of the SQUID appears as a distorted sine wave with a period equal to the flux quantum: ($\phi_o$=h/2e ≈2femtoWebers), where h is Plank's constant and e is the charge on an electron. Only fields smaller than one-half $\phi_o$ can be uniquely detected because any change in the magnetic field of greater than one-half $\phi_o$ results in a nonmonotonic (multivalued) output signal. This small limiting field strength provides little dynamic range and has little practical value.

Systems using SQUIDs for non-destructive testing/evaluation of materials or structures or for making biomagnetic measurements were long impractical for use in field settings (i.e., environments containing high levels of magnetic interference). The prior art had been limited to a flux modulation frequency of approximately 500 kHz with a maximum tracking loop bandwidth of 250 kHz. In magnetically unshielded environments, large amplitude or high slew rate external stray magnetic fields from 50/60 Hz AC power lines, AM broadcast transmitters, small changes in the Earth's magnetic field, and other sources, caused the FLL to lose lock and thereby invalidate any measurement in progress. Furthermore, the prior art employed traditional twisted-pair wires which were highly undesirable for several reasons, including that they had a high degree of linear attenuation versus frequency that severely distorts square waves of even moderate frequencies, they allowed for a large amount of radiated leakage and corresponding susceptibility to radio-frequency interference, and they had a highly variable characteristic impedance that changed with mechanical stress and was difficult to impedance match. The incorporation of digital signal processing (DSP) technology into the FLL had been attempted with limited success due to inherent delays associated with signal acquisition, processing and reconstruction of the feedback signal, and the maximum clock frequency of the DSP. Because of these problems, early attempts to incorporate DSP into the FLL failed to increase the operating frequency above that obtainable with standard analog read-out systems. For these reasons, SQUIDs were restricted to use in controlled environments shielded from magnetic interference, and were typically expensive, bulky, and non-portable.

A great many of these limitations and disadvantages were overcome by the improvements and advances disclosed in U.S. Pat. Nos. 6,420,868; 6,448,767; and 6,356,078 (the '868, '767, and '078 patents, respectively). More specifically, the '868 patent discloses read-out electronics incorporating innovative circuit designs that extend the frequency of operation of the FLL and improve upon the earlier prior art by a factor of at least ten, thereby making operation of the SQUID practical in unshielded environments by alleviating the effects of high levels of magnetic interference on SQUID measurements. The '868 patent also discloses replacing traditional twisted-pair wires with shielded, unbalanced, controlled-impedance transmission lines to overcome many of the problems encountered in the earlier prior art, including reducing the amount of radiated leakage and corresponding susceptibility to radio-frequency interference. The '868 patent also discloses employing DSP algorithms to filter, extract, and measure the weak SQUID output signal. Problems encountered in earlier attempts to incorporate DSP technology into SQUID read-out electronics were overcome by locating the DSP outside of the FLL.

The '767 patent discloses implementing the FLL with analog and radio-frequency (RF) components to improve upon the earlier prior art by a factor of at least ten. The use of RF techniques results in a flux modulation frequency of at least 33 MHz and a maximum tracking loop bandwidth of at least 5 MHz. The FLL is thus able to track, without unlocking, undesired high slew rate magnetic interference, thereby further eliminating the need for expensive and restrictive magnetic shielding for the SQUID.

The '078 patent discloses a system with continuous signals and no time switching devices and therefore none of the associated problems found in the earlier prior art. The '078 patent also discloses operating a plurality of RF FLLs and their associated SQUIDs on different flux modulation frequencies ($f_1$ through $f_N$). This allows for a 1×N architecture which reduces from 2N to N+1 the number of required cable connections between the cryogenic SQUIDs and their associated room temperature read-out electronics. Thus, for example, a system comprising an array of ten SQUIDs, which previously would have required at least twenty cable connections, with their associated heat transfer and added complexity, now requires only eleven connections. The '078 patent also discloses reducing redundancy of FLL componentry by sharing certain components among the SQUID subsystems, thereby reducing complexity, cost, and size of the system as a whole. Thus, while each SQUID still requires some dedicated, frequency-specific FLL componentry, other non-frequency-specific FLL component functions are performed by shared or common components.

Thus, the '868, '767, and '078 patents greatly improved upon and enhanced the usability of prior art FLLs and SQUIDs. These prior art patents, however, refer to and make use of only modulated FLLs. Unfortunately, modulation is associated with a greater number of electronic components, a greater number of more difficult adjustments, and distortion-producing non-linear RF components such as, for example, modulation oscillators, that emit RF interference. Modulation of the SQUID transfer function can also create unwanted distortion and signal sidebands with high level magnetic field signals applied to the SQUID. Modulated FLLs also require substantial bandwidth to process signal information. Modulated FLLs are also non-linear and therefore require band-limiting RF filters, which results in lower slew rates and narrower tracking bandwidths Due to the above-identified and other problems and disadvantages in the prior art, a need exists for an improved FLL for use with a SQUID in a system for measuring magnetic fields.

SUMMARY OF THE INVENTION

The present invention overcomes the above-described and other problems and disadvantages in the prior art with a system for measuring magnetic fields, wherein the system comprises an unmodulated or direct-feedback FLL connected by first and second unbalanced RF coaxial transmission lines to a SQUID. The FLL operates for the most part in a room-temperature or non-cryogenic environment, while the SQUID operates in a cryogenic environment, with the first and second lines extending between these two operating environments.

The FLL maintains a stable magnetic flux operating point at the SQUID by introducing a feedback magnetic flux that precisely counteracts an externally applied magnetic field. Measurements of this external magnetic flux can then be made by measuring the feedback signal which is an identical image of the external magnetic flux signal within the tracking bandwidth of the FLL.

The FLL broadly includes a bias tee; an impedance match; a low noise amplifier; a loop gain adjustment; a first DC amplifier; a first integrator network; a second DC amplifier with a DC offset adjustment; a second integrator network; an output amplifier; and a matching combiner. The bias tee is a controlled-impedance bias tee that allows both for injecting an operating bias current into the SQUID and for extracting the output signal generated by the SQUID via the second line. The impedance match terminates the second line in its characteristic impedance at the input of the low noise amplifier to prevent signal reflections and re-reflections from occurring. The low noise amplifier operates down to DC and amplifies the weak SQUID output signal from DC to the bandwidth limit of the low noise amplifier. The loop gain adjustment is used to optimize the gain of the FLL for different SQUIDs, thereby allowing for optimizing performance both by preventing the FLL from oscillating and by maintaining the slew rate and bandwidth of the FLL at a desired level. The first DC amplifier is wideband and similar to the low noise amplifier. The first integrator network is a passive lead-lag network that functions in conjunction with the second integrator network to provide the poles and zeros required for stable phase locked feedback of the SQUID output signal.

The second DC amplifier performs four basic functions: providing wideband signal gain, providing a low output driving point impedance for the second integrator network, providing a place for controlling the DC offset of the loop using the DC offset adjustment, and providing a high input impedance for the first integrator network. The DC offset adjustment is required with all FLLs, whether modulated or unmodulated, and the amount of DC offset voltage is approximately the same for either system. In the present invention, however, changing the length of the first or second lines does not require re-adjustment of the DC offset.

The second integrator network is a lead-lag passive network having an additional zero and operating in conjunction with the first integrator network to provide the overall performance of a two-pole integrator. This maximizes the signal tracking frequency range and slew rate and creates an unconditionally stable feedback loop. The overall loop performance depends on the combined effect of both the first and second integrator networks working together. The output amplifier must meet several requirements for FLL operation, including being a wideband DC amplifier, presenting a high impedance to the second integrator network, and driving undistorted feedback current into the low impedance first line and the feedback coil of the SQUID. The matching combiner matches the low characteristic impedance of the first line and combines any external input signals used.

The SQUID is adapted and operable in a conventional manner to detect changes in magnetic flux. The SQUID is the only non-linear device in the system. The first unbalanced RF coaxial transmission line extends between the SQUID and the matching combiner of the FLL. The second unbalanced RF coaxial transmission line extends between the SQUID and the bias tee of the FLL.

Thus, it will be appreciated that the system and, more particularly, the FLL of the present invention provides a number of substantial advantages over the prior art, including, for example, that the direct-feedback FLL is the simplest way to linearize the SQUID. The direct-feedback FLL also uses fewer, smaller, and less expensive electronic components; requires fewer adjustments which are easier to make; and eliminates distortion-producing, non-linear, bulky, and expensive RF components used in prior art modulated FLLs.

These and other important features of the present invention are more fully described in the section titled DETAILED DESCRIPTION OF A PREFERRED EMBODIMENT, below.

BRIEF DESCRIPTION OF THE DRAWINGS

A preferred embodiment of the present invention is described in detail below with reference to the attached drawing figures, wherein:

FIG. 2 is a first circuit schematic of a first integrator network component of the direct-feedback FLL of FIG. 1;

FIG. 3 is a first equation describing the circuit schematic of FIG. 2;

FIG. 4 is a second circuit schematic of a second integrator network component of the direct-feedback FLL of FIG. 1; and FIG. 5 is a second equation describing the second circuit schematic of FIG. 4.

DETAILED DESCRIPTION OF A PREFERRED EMBODIMENT

Figure 1:
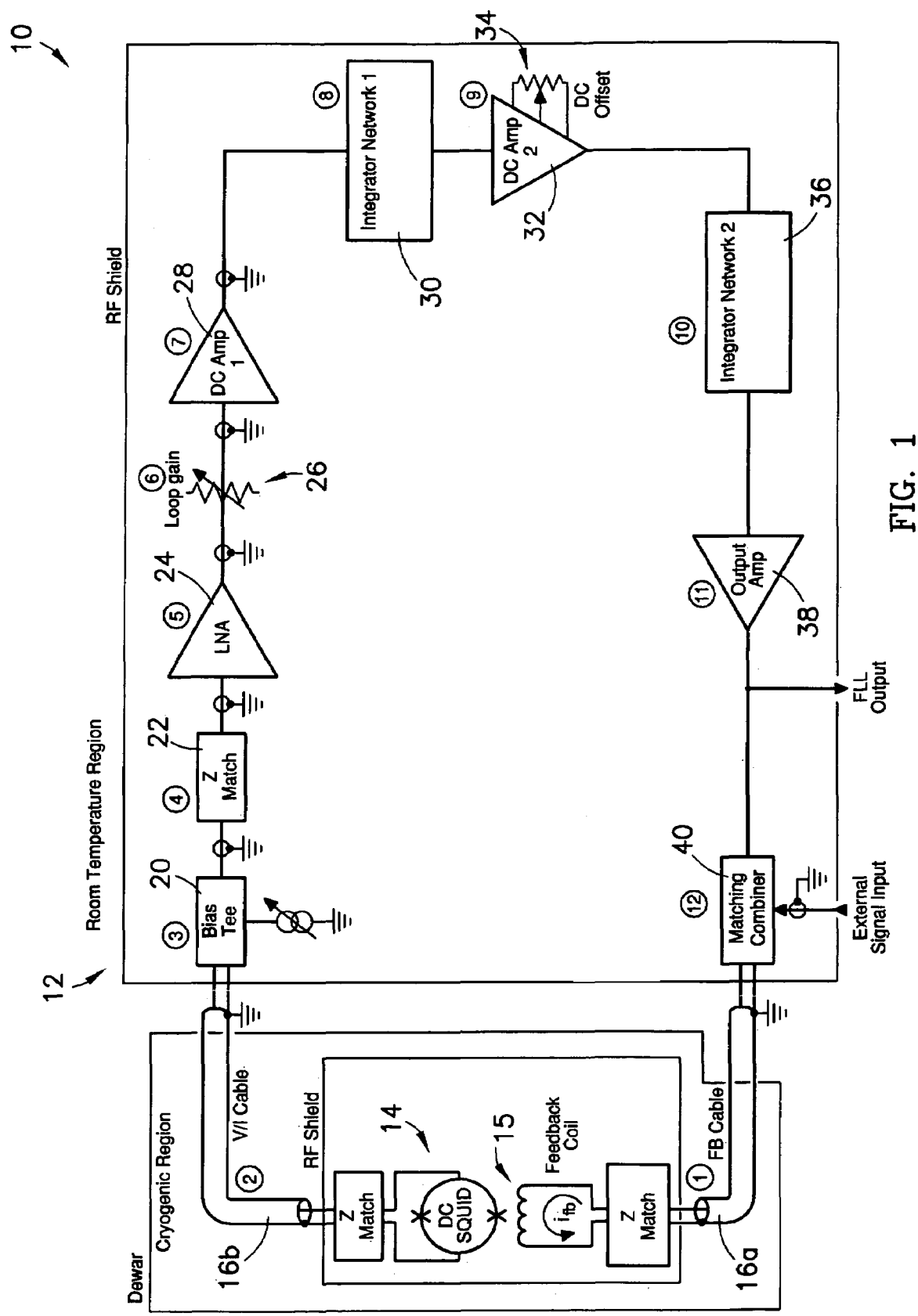
FIG. 1 is a block diagram showing a preferred embodiment of the system of the present invention, comprising a direct-feedback FLL connected by unbalanced RF coaxial transmission lines to a SQUID.

With reference to the figures, a system 10 for measuring magnetic fields is herein described, shown, and otherwise disclosed in accordance with a preferred embodiment of the present invention. The subject matter disclosed in U.S. Pat. No. 6,420,868, titled "Read-out Electronics for DC SQUID Magnetic Measurements", issued Jul. 16, 2002; U.S. Pat. No. 6,448,767, titled "Fast Flux Locked Loop", issued Sep. 10, 2002; and U.S. Pat. No. 6,356,078, titled "Frequency Multiplexed Flux Locked Loop Architecture Providing an Array of DC SQUIDS Having Both Shared and Unshared Components", issued Mar. 12, 2002, is incorporated by reference into the present specification. The identified patents disclose various improvements for systems for measuring magnetic fields and, more particularly, for the FLLs of those systems. Whereas, however, the identified patents refer to and make use of only modulated FLLs, the present invention advantageously allows for using an unmodulated or direct-feedback FLL and realizing the benefits and advantages associated therewith.

Referring particularly to FIG. 1, a preferred embodiment of the system 10 of the present invention broadly comprises the aforementioned unmodulated or direct-feedback FLL 12 connected to a SQUID 14 having a feedback coil 15 by first and second unbalanced RF coaxial transmission lines 16a, 16b. The FLL 12 operates for the most part in a room-temperature or non-cryogenic and magnetically unshielded environment, while the SQUID 14 operates in a cryogenic environment. The first and second lines 16a, 16b, extend between these two operating environments.

The FLL 12 is adapted and operable to maintain a stable magnetic flux operating point at the SQUID 14 by introducing a feedback magnetic flux that precisely counteracts an externally applied magnetic field. Measurements of this external magnetic flux can then be made by measuring the feedback signal which is an identical image of the external magnetic flux signal within the tracking bandwidth of the FLL 12. The FLL 12 broadly includes a bias tee 20; an impedance (or "Z") match 22; a low noise amplifier (LNA) 24; a loop gain adjustment 26; a first DC amplifier 28; a first integrator network 30; a second DC amplifier 32 with a DC offset adjustment 34; a second integrator network 36; an output amplifier 38; and a matching combiner 40.

The bias tee 20 is a controlled-impedance bias tee that allows both for injecting the operating bias current into the SQUID 14 and for extracting the output signal generated by the SQUID 14 via the second line 16b. The operating bias current may be either DC or alternating DC (AC) depending on the application, and is selected for the particular SQUID 14. The bias port of the bias tee 20 is a high impedance port that does not load or change the termination matching impedance at the LNA 24.

The Z match 22 terminates the second line 16b in its characteristic impedance at the input of the LNA 24. This termination is desirable to prevent the signals sent from the SQUID 14 to the LNA 24 from being reflected back to the SQUID 14. Because the cryogenic end of the second line 16b may not be terminated in the line impedance, any signal reflected at the LNA 24 would be re-reflected from the SQUID unstable and unlock. Thus, the Z match 22 terminates the second line 16b in its characteristic impedance at the LNA 24 to prevent such re-reflections from occurring.

The LNA 24 operates down to DC (in contrast to the RF LNAs commonly used in the prior art) and amplifies the weak SQUID output signal from DC to the bandwidth limit of the LNA 24. The present state of the art allows high gain DC amplifiers to operate beyond 200 MHz. In the prior art, modulated FLLs typically provide a step-up transformer at the input of the LNA to improve the noise figure. In the present invention, however, because the LNA 24 operates down to DC, a transformer cannot be used. In the direct-feedback FLL 12, with the second line 16b being terminated in its characteristic impedance, the low impedance termination (typically 50 or 75 Ohms) is the most favorable input impedance for the LNA 24 for best noise performance. The overall noise performance is typically as good as that of the RF LNAs used in the prior art. The noise from high-temperature SQUIDs dominates the amplifier noise in either case.

The loop gain adjustment 26 is used to optimize the gain of the FLL 12 for different SQUIDs. As with any feedback loop, if the gain becomes too high the phase margin may become too small, causing the loop to oscillate. Conversely, if the loop gain is too low the slew rate and bandwidth of the FLL 12 may be poor. Thus, the loop gain adjustment 26 allows for optimizing performance. One way of determining the optimum adjustment is to monitor the locked FLL 12 at its output with an RF spectrum analyzer so that, as the loop gain is changed, a noise peak can be observed and used as an indication of loop stability. If the gain is increased too far the noise peak becomes very sharp and narrow, indicating a loss of phase margin.

The same peaking effect can be observed with prior art modulated FLLs if the locked loop is monitored at the input to the mixer. The RF signal can then be observed with the RF spectrum analyzer at the flux modulator carrier frequency. The RF signal for the modulated FLL, which is much more complex than that of the direct-feedback FLL 12 of the present invention, is a double sideband suppressed carrier (DSB-SC) signal. Both sideband peaks and the RF carrier suppression can be observed on the spectrum analyzer. The amplitude match of the upper and lower sidebands is dependent upon the flux modulation square wave fidelity, both duty cycle symmetry and rise/fall times. If the sum of the rise and fall times becomes greater than 8–10% of the period of the square wave, then the SQUID becomes less sensitive. The less ideal the square wave, the more the signal spectrum is distorted. Distortion in the signal spectrum also translates to more distortion of the SQUID's output signals because these are non-linear effects. The carrier suppression of the DSB-SC signal depends on the reactance of the feedback coil at the modulation frequency. At high carrier frequencies, the presence of a large amplitude carrier at the output of the RF amplifiers means that the loop gain must be reduced to avoid amplifier saturation, this reduces both the slew rates and the bandwidth of the modulated FLL. It should be noted, however, that a special SQUID could be designed with a feedback coil having very low inductance to accommodate high carrier frequencies, but this can also reduce the SQUID's sensitivity. Thus, the increased complexity of modulated RF carrier FLLs makes them much more difficult to manage than the simpler direct-feedback FLL 12 of the present invention.

It will be appreciated that spectral peaking of the locked loop noise occurs in both modulated and unmodulated systems because as the magnetic flux input frequency increases beyond a certain limit the FLL gradually loses the ability to track the signal. The broadband nature of white noise produces the noise peak as the closed loop error signal becomes larger.

The first DC amplifier 28 is a wideband DC amplifier that is similar to the LNA 24. It should be noted that if it is desirable to test an FLL without connecting a SQUID, doing so is much easier with the direct-feedback FLL 12 of the present invention because a DSB-SC signal is not needed. A passive resistance combiner can be easily substituted in place of the SQUID 14 as a loop summing junction so that all of the room-temperature FLL electronics can be actively tested in open or closed loop form without using the SQUID 14. This is much more difficult with modulated systems because a nonlinear device, such as, for example a mixer, is required to simulate the DSB-SC SQUID action.

When using a passive-summing junction in place of the SQUID 14, the input signal must be inverted at some point within the loop to ensure negative feedback. In this case, it may be convenient to configure the first DC amplifier 28 as an inverting amplifier. An inverting stage is not necessary when using the SQUID 14. The dual slope characteristic of the sinusoidal transfer function of the SQUID 14, when properly biased, causes the loop to seek the operating point slope necessary to lock the loop.

Referring also to FIG. 2, the first integrator network 30 is a passive lead-lag network that functions in conjunction with the second integrator network 36 to provide the poles and zeros required for stable phase locked feedback of the SQUID's output signal. The general network equation 44 for the first integrator network 30 is shown in FIG. 3. The component value of capacitor $C_{11}$ depends on the particular amplifiers selected, and may be optional in some cases.

For very high speed wide bandwidth integrators, a passive network followed by an amplifier stage is superior to an active integrator, where the reactive components are part of the amplifier feedback. In an active integrator, the feedback components operate with an active or virtual ground at the amplifier output. The virtual ground becomes ineffective at higher frequencies because the amplifier's impedance changes with frequency. At sufficiently high frequency, an active integrator looks like a straight-through series capacitor rather than a capacitor to ground. In the present invention, the two passive integrator networks 30,36 give superior slew rate and bandwidth performance over popular active integrators.

The second DC amplifier 32 performs four basic functions: providing wideband signal gain, providing a low output driving point impedance for the second integrator network 36, providing a place for controlling loop DC offset using the DC offset adjustment 34, and providing a high input impedance for the first integrator network 30. The DC offset adjustment 34 is required with all FLLs, whether modulated or unmodulated, and the amount of DC offset voltage is approximately the same for either system. A modulated FLL has a disadvantage, however, because it requires re-adjustment every time the transmission line length is changed. Changing the line length causes a large change in the DC offset voltage that is created by the phase detection action of the homodyne receiver RF mixer, where the mixer DC output is a function of the phase difference between the flux modulation local oscillator and the DSB-SC input signal. In the present invention, changing the length of the first or second lines 16a, 16b does not require re-adjustment of the offset.

Referring also to FIG. 4, the second integrator network 36 is a lead-lag passive network having an additional zero and operating in conjunction with the first integrator network 30 to provide the overall performance of a two-pole integrator. Two-pole integrators, when properly stabilized by lead-lag networks, maximize the signal tracking frequency range and slew rate. In the present invention, the integrator networks 30,36 also create an unconditionally stable feedback loop. The loop will remain stable and not oscillate as the gain is reduced from the optimum setting, regardless of the lengths of the first and second lines 16a, 16b. With long transmission line lengths, the loop remains stable with only a slight degradation in slew rate and tracking bandwidth.

The overall loop performance depends upon the combined effect of both the first and second integrator networks 30,36 working together. The general network equation 46 for the second integrator network 36 is shown in FIG. 5. As with the first integrator network 30, capacitor $C_{21}$ is optional. The zeros in the transfer functions formed by capacitor $C_{11}$ and resistor $R_{11}$ in the first integrator network 30 and by capacitor $C_{21}$ and resistor $R_{21}$ in the second integrator network 36, have a significant effect on extending the tracking bandwidth of the FLL 12 to higher frequencies. The values of capacitor $C_{11}$ and capacitor $C_{21}$ depend on the desired high frequency performance of the FLL 12 and the required phase margin for loop stability.

The output amplifier 38 should meet several requirements for FLL operation. In addition to being a wideband DC amplifier, the output amplifier 38 should present a high impedance to the second integrator network 36 and drive undistorted feedback current into the low impedance first line 16a and the feedback coil 15 of the SQUID 14. Commonly used current sources in prior art FLLs are high impedance (i.e., a voltage source and a high value resistor in series) such that, regardless of changes in the load impedance seen by the source, the current to the load will remain constant. In the present invention, the current source that the SQUID 14 sees is a low impedance source that terminates the first line 16a at the source end. The output amplifier 38 delivers the current into the load. When the loop is locked, the SQUID signal voltage seen at the output amplifier 38 depends on the losses between the output amplifier 38 and the feedback coil 15 of the SQUID 14. The greater the loss, the higher the voltage swing at the amplifier output for a given SQUID signal. The advantage of a low impedance source is a lower room-temperature Johnson noise current injected into the feedback coil 15. To ensure loop stability, the bandwidth of the output amplifier 38 should not be greater than the bandwidth of the first DC amplifier 28 that precedes the first and second integrator networks 30,36.

The matching combiner 40 should, at a minimum, match the low characteristic impedance of the first line 16a and combine any external input signals used. The matching combiner 40 may take different forms depending on the particular application. For test purposes, external signals can be injected after the output amplifier 38 and appear as if they were injected directly into the feedback coil 15. These signals can be used for testing the system 10 either open or closed loop. The matching combiner 40 can be either a symmetrical impedance device or an unsymmetrical matching device. For example, it may be desirable to match the first line 16a in its characteristic impedance, the external input in the same impedance, and the amplifier output to a higher impedance. This type of matching would allow the output amplifier 38 to swing a higher voltage for a given SQUID signal. The DC amplifiers 28, 32 in the loop should have extra gain to make up for this additional combiner loss. Other variations are easily achievable with the present invention.

The SQUID 14 is adapted and operable in a conventional manner to detect changes in magnetic flux. The SQUID 14 is the only non-linear component of the system 10.

The first unbalanced RF coaxial transmission line 16a connects the matching combiner 40 of the FLL 12 to the feedback coil 15 of the SQUID 14. When the first line 16a is matched at the source but not at the load a reflection will occur from the load that will be absorbed in the matching source impedance. The current waveform at the load is preserved, but not the voltage waveform. The magnetic flux injected into the SQUID 14 is, however, determined only by the current through the feedback coil 15 and is unaffected by the voltage, thereby preserving signal fidelity.

Alternatively, the first line 16a can be matched with a resistive match to eliminate the resulting standing waves, but this would also create a signal loss. This loss is not a serious problem, however, as it simply reduces the overall loop gain of the FLL 12 which can be made up in the first and second DC amplifiers 28,32. When there is sufficient loop gain, an additional loss, in the form of a low impedance unbalanced matching cold attenuator, can be added to the system 10 for performance enhancement and to further reduce the Johnson noise injected into the feedback coil 15 of the SQUID 14. This also reduces the 1/f noise problem seen in prior art FLLs that use high impedance room-temperature current sources.

The second unbalanced RF coaxial transmission line 16b connects the bias tee 20 of the FLL 12 to the SQUID 14. Matching the second line 16b at the low-temperature end in the direct-feedback FLL 12 of the present invention is different than matching the same line in a modulated FLL. In a modulated FLL, a cold RF transformer can be used to match the SQUID (approximately 3 Ohm impedance) to the line (typically 50 or 75 Ohms). The transformer match eliminates standing waves on the line and also provides a noise free voltage step-up of the weak SQUID signals. In the direct-feedback FLL 12, which has no RF carrier, the match must be resistive and operate down to DC. The resistive match creates a SQUID signal loss that adds directly to the noise figure of the LNA 24. The best noise performance for the direct-feedback FLL 12 of the present invention is given when no matching is used at the low-temperature end of the second line 16b at the SQUID 12. Thus, the characteristic impedance of the second line 16b is preferably matched at the load (the end connected to the bias tee 20) but not at the source (the end connected to the SQUID 12), so that a signal sent by the source will be absorbed by the load and no reflections occur. Because the source impedance is much lower than the characteristic impedance of the second line 16b, the source voltage is preserved at the load with voltage nearly equal to the open circuit source value.

If an RF transmission line is not terminated in its characteristic impedance, signal reflections and standing waves occur that can cause distortion in the voltage and current waveforms. In typical RF systems, all transmission lines are matched at both ends to minimize reflections, standing waves, and signal distortion and simultaneously provide maximum power transfer from the source to the load. However, depending on the characteristics of a particular system, matching at both ends may not be necessary. By terminating a transmission line at one end only, it is possible to preserve the desired waveform characteristic at the load.

Impedance matching of the first and second lines 16a, 16b at the SQUID 14 is optional and may be desirable for some applications. A lower-quality flexible cable can be used for the first and second lines 16a, 16b if both ends are matched. Because there are no standing waves and there is an energy absorbing match at each end, the shield of the coaxial cable is not as easily penetrated by externally produced RF interference and the high gain FLL 12 remains interference free.

Generally, the coaxial transmission cables are an extension of the loop summing junction which is normally located at the SQUID itself. Any RF interference signals induced in the cable appear as distortion of the desired SQUID signals. The open loop gain of a high performance FLL may be greater than 100 dB in closed loop operation, so the effectiveness of the coaxial shielding must exceed the open loop gain to ensure that any signals penetrating the cable shield will drop below the noise floor of the locked loop and not distort the desired signals. The signal penetration potential of the shield of a transmission line is much greater if the line has high standing waves.

When, in the present invention, high quality shielded cable is used for the first and second lines 16a, 16b, a major benefit accrues from removing the matching components and connecting the first and second lines 16a, 16b directly to the SQUID 14 and feedback coil 15. The complete elimination of cryogenic circuit parts enables the first and second lines 16a, 16b to be connected directly to closely-packed SQUIDs in an array. In doing so, there is no degradation of the LNA noise nor is there RF interference distortion of the loop signals.

From the preceding description it will be appreciated that the system 10 and, more particularly, the FLL 12 of the present invention provides a number of substantial advantages over the prior art, including, for example, that the direct-feedback FLL 12 is the simplest way to linearize the SQUID 14. The direct feedback FLL 12 also has fewer electronic components, requires fewer adjustments, and eliminates distortion-producing non-linear RF components used in prior art modulated FLLs. In the prior art, modulation of the transfer function of the SQUID 14 can create unwanted signal sidebands with high level magnetic field signals applied to the SQUID 14. These undesired sidebands add distortion in a modulated FLL, but are not present in the direct-feedback FLL 12 of the present invention.

Furthermore, the direct-feedback FLL 12 also needs only half the bandwidth required by prior art modulated FLLs to process the same signal information. Additionally, the direct-feedback FLL 12 is linear, so band-limiting RF filters needed to correct for distortion in modulated FLLs can be eliminated. This, in turn, allows for obtaining higher slew rates and wider tracking bandwidths. Higher slew rates mean that the direct-feedback FLL 12 can more readily eliminate the need for expensive magnetically-shielded operating environments and thereby widen the field of possible practical applications for SQUIDs. Also, the direct-feedback FLL 12 has no modulation oscillator and therefore does not emit troublesome RF interference.

Additionally, the direct-feedback FLL 12 uses feedback control techniques to linearize the SQUID transfer characteristic and greatly expand the SQUID's dynamic range to hundreds of $\phi_o$. It will be appreciated, however, that every control loop has a built-in speed limit, determined primarily by the bandwidth of the loop, that limits the ability of the loop to track an unknown signal with a large slew rate. Generally, if an FLL can be made fast enough, with wide bandwidth and high slew rate performance, then the FLL can track large-magnitude high-frequency signals. The direct-feedback FLL 12 of the present invention provides, at very low cost, slew rate performance that is significantly faster than the prior art, which further allows for operating the SQUID 14 in normal magnetic field environments. Additionally, the direct-feedback FLL 12 is completely shielded from RF interference. Magnetic fields can, however, penetrate RF shielding, thereby allowing the SQUID 14 to function normally without interference from external RF interference sources.

The advantages noted in the above-identified patents of using shielded coaxial unbalanced transmission lines apply to the direct-feedback FLL 12 of the present invention as well, even though there is no high frequency modulation carrier signal. Thus, the twisted-pair cables of prior art FLLs are eliminated, thereby reducing or eliminating the instability associated therewith. Additionally, the bulky and expensive RF amplifiers used in the identified patents can be replaced in the present invention with commercially-available DC amplifiers having bandwidths exceeding 200 MHz. Thus, the components of the FLL 12 can be made much smaller, less expensive, and easier to use due to the elimination of these bulky and expensive RF components and the need for fewer adjustments.

Although the invention has been described with reference to the preferred embodiments illustrated in the drawings, it is noted that equivalents may be employed and substitutions made herein without departing from the scope of the invention as recited in the claims. The present invention is unconcerned, for example, with the specific electronic components or their characteristics or the specific SQUID that may be chosen based on considerations associated with a particular application.

Having thus described the preferred embodiment of the invention, what is claimed as new and desired to be protected by Letters Patent includes the following:

The invention claimed is:

1. A system for measuring magnetic fields using a superconducting quantum interference device, wherein the system comprises:
   an unmodulated flux locked loop including only linear, wide-band DC componentry and operable to achieve a substantially stable operating point at the superconducting quantum interference device; and
   a coaxial transmission line adapted to electrically connect the unmodulated flux locked loop and the superconducting quantum interference device.

2. The system as set forth in claim 1, wherein the non-cryogenic environment is a magnetically unshielded environment.

3. A system for measuring magnetic fields using a superconducting quantum interference device, wherein the system comprises:
   an unmodulated flux locked loop operable to achieve a substantially stable operating point at the superconducting quantum interference device;
   a coaxial transmission line adapted to electrically connect the unmodulated flux locked loop and the superconducting quantum interference device;
   a controlled-impedance bias tee operable to send a bias current into the superconducting quantum interference device and to receive an output signal generated by the superconducting quantum interference device via the coaxial transmission line;
   a low noise amplifier operable to amplify the output signal generated by the superconducting quantum interference device;
   a loop gain adjustment for optimizing performance of the unmodulated flux locked loop;
   a first DC amplifier for amplifying an output of the low noise amplifier;
   a first integrator network operable to facilitate achieving a stable phase locked feedback of the output signal generated by the superconducting quantum interference device;
   a second DC amplifier for providing a wideband signal gain;
   an offset adjustment device for adjusting a DC offset of an output of the first integrator network;
   a second integrator network operating in conjunction with the first integrator network to provide performance of a two-pole integrator; and
   an output amplifier for amplifying an output of the second integrator network.

4. The system as shown in claim 3, wherein the first and second integrator networks are each a passive lead-lag network.

5. A system for measuring magnetic fields, wherein the system comprises:
   a superconducting quantum interference device operable to detect changes in magnetic flux;
   an unmodulated flux locked loop including only linear, wide-band DC componentry for achieving a substantially stable magnetic flux operating point at the superconducting quantum interference device by introducing a feedback magnetic flux that counteracts an externally applied magnetic field;
   a first unbalanced coaxial transmission line for carrying a feedback signal corresponding to the externally applied magnetic field from the unmodulated flux locked loop to the superconducting quantum interference device; and
   a second unbalanced coaxial transmission line both for carrying a bias current from the unmodulated flux locked loop to the superconducting quantum interference device and for carrying an output signal from the superconducting quantum interference device to the unmodulated flux locked loop,
   wherein the superconducting quantum interference device is located in a cryogenic environment, the unmodulated flux locked loop is located in a non-cryogenic environment, and the first and second unbalanced coaxial transmission lines extend between the cryogenic environment and the non-cryogenic environment.

6. The system as set forth in claim 5, wherein the non-cryogenic environment is a magnetically unshielded environment.

7. The system as set forth in claim 5, wherein the unmodulated flux locked loop includes
   a controlled-impedance bias tee for sending the bias current into the superconducting quantum interference device and for receiving the output signal generated by the superconducting quantum interference device via the second unbalanced coaxial transmission line;
   an impedance match for terminating the second unbalanced coaxial transmission line in a characteristic impedance of the second unbalanced coaxial transmission line;
   a low noise amplifier for amplifying the output signal of the superconducting quantum interference device;
   a loop gain adjustment for optimizing performance of the unmodulated flux locked loop;
   a first DC amplifier for amplifying an output of the low noise amplifier;

a first integrator network for facilitating achieving a stable phase locked feedback of the output signal of the superconducting quantum interference device;

a second DC amplifier for providing a wideband signal gain;

an offset adjustment for adjusting a DC offset of an output of the first integrator network;

a second integrator network operating in conjunction with the first integrator network to provide performance of a two-pole integrator;

an output amplifier for amplifying an output of the second integrator network; and a matching combiner for matching a characteristic impedance of the first unbalanced coaxial transmission line.

8. The system as shown in claim 7, wherein the first and second integrator networks are each a passive lead-lag network.

9. The system as set forth in claim 5, wherein the first unbalanced coaxial transmission line is impedance matched at the unmodulated flux locked loop and is not impedance matched at the superconducting quantum interference device.

10. The system as set forth in claim 5, wherein the second unbalanced coaxial transmission line is impedance matched at the unmodulated flux locked loop and is not impedance matched at the superconducting quantum interference device.

11. The system as set forth in claim 5, wherein the first and second unbalanced coaxial transmission lines are impedance matched at both the unmodulated flux locked loop and the superconducting quantum interference device.

12. A system for measuring magnetic fields, wherein the system comprises:

a superconducting quantum interference device operable to detect changes in magnetic flux;

an unmodulated flux locked loop for achieving a substantially stable magnetic flux operating point at the superconducting quantum interference device by introducing a feedback magnetic flux that counteracts an externally applied magnetic field, wherein the unmodulated flux locked loop includes only linear, wide-band DC componentry, and wherein the unmodulated flux locked loop is located in a non-cryogenic and magnetically unshielded environment;

a first unbalanced RF coaxial transmission line for carrying a feedback signal corresponding to the externally applied magnetic field from the unmodulated flux locked loop to the superconducting quantum interference device; and a second unbalanced RF coaxial transmission line both for carrying a bias current from the unmodulated flux locked loop to the superconducting quantum interference device and for carrying an output signal from the superconducting quantum interference device to the unmodulated flux locked loop.

13. The system as set forth in claim 12, wherein the superconducting quantum interference device is located in a substantially cryogenic environment, and the first and second unbalanced RF coaxial transmission lines extend between the cryogenic environment and the non-cryogenic environment.

14. The system as set forth in claim 12, wherein the unmodulated flux locked loop includes a controlled-impedance bias tee for sending the bias current into the superconducting quantum interference device and for receiving the output signal generated by the superconducting quantum interference device via the second unbalanced RF coaxial transmission line;

an impedance match for terminating the second unbalanced RF coaxial transmission line in a characteristic impedance of the second unbalanced RF coaxial transmission line;

a low noise amplifier for amplifying the output signal of the superconducting quantum interference device;

a loop gain adjustment for optimizing performance of the unmodulated flux locked loop;

a first DC amplifier for amplifying an output of the low noise amplifier;

a first integrator network for facilitating achieving a stable phase locked feedback of the output signal of the superconducting quantum interference device, wherein the first integrator network is a first passive lead-lag network;

a second DC amplifier for providing a wideband signal gain;

an offset adjustment for adjusting a DC offset of an output of the first integrator network;

a second integrator network operating in conjunction with the first integrator network to provide performance of a two-pole integrator, wherein the second integrator network is a second passive lead-lag network;

an output amplifier for amplifying an output of the second integrator network; and a matching combiner for matching a characteristic impedance of the first unbalanced RF coaxial transmission line.

15. The system as set forth in claim 12, wherein the first unbalanced RF coaxial transmission line is impedance matched at the unmodulated flux locked loop and is not impedance matched at the superconducting quantum interference device.

16. The system as set forth in claim 12, wherein the second unbalanced RF coaxial transmission line is impedance matched at the unmodulated flux locked loop and is not impedance matched at the superconducting quantum interference device.

17. The system as set forth in claim 12, wherein the first and second unbalanced RF coaxial transmission lines are impedance matched at both the unmodulated flux locked loop and the superconducting quantum interference device.

18. The system as set forth in claim 1, wherein the unmodulated flux locked loop is located in a non-cryogenic environment, and the coaxial transmission line is adapted to extend between the non-cryogenic environment and the superconducting quantum interference device.

* * * * *